(12) United States Patent
Farrar

(10) Patent No.: US 7,202,562 B2
(45) Date of Patent: Apr. 10, 2007

(54) INTEGRATED CIRCUIT COOLING SYSTEM AND METHOD

(75) Inventor: Paul A. Farrar, Bluffton, SC (US)

(73) Assignee: Micron Technology, Inc., Boise, ID (US)

( * ) Notice: Subject to any disclaimer, the term of this patent is extended or adjusted under 35 U.S.C. 154(b) by 97 days.

(21) Appl. No.: 11/001,930

(22) Filed: Dec. 2, 2004

(65) Prior Publication Data

US 2006/0118949 A1 Jun. 8, 2006

(51) Int. Cl.
*H01L 23/34* (2006.01)

(52) U.S. Cl. ............... 257/721; 257/713; 257/E23.099

(58) Field of Classification Search .............. 257/721
See application file for complete search history.

(56) References Cited

U.S. PATENT DOCUMENTS

| | | | |
|---|---|---|---|
| 5,303,555 | A | 4/1994 | Chrysler et al. |
| 5,461,003 | A | 10/1995 | Havemann et al. |
| 5,593,926 | A | 1/1997 | Fujihira |
| 5,673,561 | A | 10/1997 | Moss |
| 5,869,880 | A | 2/1999 | Grill et al. |
| 5,891,797 | A | 4/1999 | Farrar |
| 5,994,777 | A | 11/1999 | Farrar |
| 6,028,348 | A | 2/2000 | Hill |
| 6,077,792 | A | 6/2000 | Farrar |
| 6,307,194 | B1 | 10/2001 | Fitzgibbons et al. |
| 6,413,827 | B2 | 7/2002 | Farrar |
| 6,433,413 | B1 | 8/2002 | Farrar |
| 6,574,968 | B1 | 6/2003 | Symko et al. |
| 6,614,092 | B2 | 9/2003 | Eldridge et al. |
| 6,628,355 | B1* | 9/2003 | Takahara .................. 349/106 |
| 6,670,719 | B2 | 12/2003 | Eldridge et al. |
| 6,674,167 | B1 | 1/2004 | Ahn et al. |
| 6,679,315 | B2 | 1/2004 | Cosley et al. |
| 6,686,654 | B2 | 2/2004 | Farrar et al. |
| 6,709,968 | B1 | 3/2004 | Eldridge et al. |
| 6,725,670 | B2 | 4/2004 | Smith et al. |

(Continued)

OTHER PUBLICATIONS

"'Green' Chiller Technology Rolled Out For Earth Day", *Penn State News Release*, http://www.sciencedaily.com/releases/2004/04/040421232304.htm, (Apr. 22, 2004).

(Continued)

*Primary Examiner*—Tu-Tu Ho
(74) *Attorney, Agent, or Firm*—Schwegman, Lundberg, Woessner & Kluth, P.A.

(57) ABSTRACT

A system and method for cooling an integrated circuit is provided. One aspect of this disclosure relates to a cooling system that utilizes sound waves to cool a semiconductor structure. The system includes a container to hold at least one semiconductor chip having surfaces to be in contact with a fluid. The system also includes a transducer and a heat exchanger disposed within the container and operably positioned with respect to each other to perform a thermoacoustic cooling process. In this system, the transducer is adapted to generate sound waves within the fluid such that compression and decompression of the fluid provides a temperature gradient across the semiconductor chip to transfer heat from the semiconductor chip to the heat exchanger, and the heat exchanger is adapted to remove heat from the fluid in the container. Other aspects and embodiments are provided herein.

31 Claims, 10 Drawing Sheets

U.S. PATENT DOCUMENTS

| | | |
|---|---|---|
| 6,747,347 B2 | 6/2004 | Farrar et al. |
| 2001/0034117 A1 | 10/2001 | Eldridge et al. |
| 2002/0037603 A1 | 3/2002 | Eldridge et al. |
| 2002/0142590 A1* | 10/2002 | Pan et al. .................. 438/687 |
| 2004/0000150 A1 | 1/2004 | Symko et al. |
| 2005/0026351 A1 | 2/2005 | Farrar |
| 2005/0285220 A1 | 12/2005 | Farrar |
| 2006/0046322 A1 | 3/2006 | Farrar et al. |
| 2006/0119224 A1* | 6/2006 | Keolian et al. ............. 310/339 |

OTHER PUBLICATIONS

"Fundamentals of Sonic Cleaning", http://www.icknowledge.com/misc_technology/Megasonic.pdf, 1 page.

"Megasonics—Sage Solvent Alternatives Guide", http://clean.rti.org/alt.cfm?id=me&cat=ov, Research Triangle Institute, (Mar. 15, 1995).

"What is megasonics cleaning?", http://www.prosysmeg.com/technology/articles/megasonics_cleaning.php, ProSys, Inc., (Copyright 1997-2004).

Ballister, Stephen C., et al., "Shipboard Electronics Thermoacoustic Cooler", *Report number: A415003, Naval Postgraduate School, Monterrey, CA*, Abstract, (Jun. 1995).

Blodgett, A J., et al., "Thermal Conduction Module: A High-Performance Multilayer Ceramic Package", *IBM Journal of Research and Development*, 26(1), (1982), 30-36.

Singer, Peter, "The New Low-K Candidate: It's a Gas", *Semiconductor International*, 22(3), (Mar. 1999), 38.

Vardaman, E. J., "Future Packaging Trends: CSP vs. Flip Chip", *11th European Microelectrics Conference, Venice*, (1997), 295-299.

* cited by examiner

INTEGRATED CIRCUIT COOLING SYSTEM AND METHOD

TECHNICAL FIELD

This disclosure relates to semiconductor devices and semiconductor device fabrication, and more particularly, to structures and methods for removing heat from semiconductor devices.

BACKGROUND

Advances in the field of semiconductor manufacturing have decreased the achievable minimum feature size. This decrease in feature size has the undesirable side effect of increasing the capacitive coupling between adjacent devices. As the amount of interconnecting metallurgy increases, the capacitive coupling problem impedes performance. Efforts to minimize the effects of capacitive coupling include isolating wiring into levels with insulators or air gaps between the levels.

Due to the reduction in device size, the cross-sections of the metal connectors are correspondingly reduced. This increases the electrical resistance per unit length of these connectors, and thereby increases the generation of heat via resistive heating of the metallurgy. Compounding the problem is the additional heat generated by the charging and discharging of the devices themselves.

While heat can be extracted through the base of the silicon chip, additional cooling is highly desirable. Large systems have employed mechanical refrigeration systems, but are limited by the bulk of the condenser technology and the attainable heat transfer coefficients. Such mechanical refrigeration systems may not by desirable for small and/or portable systems.

Thermoacoustic cooling uses sound waves to control temperature, but has not been routinely used to cool semiconductor structures because of the difficulty in coupling the cooling system to the semiconductor structure due to problems such as ultrasonic cavitations and inefficient thermal coupling.

SUMMARY

Disclosed herein, among other things, is a cooling system that utilizes sound waves to cool a semiconductor structure. The system includes a container to hold at least one semiconductor chip having surfaces to be in contact with a fluid. The system also includes a transducer and a heat exchanger disposed within the container and operably positioned with respect to each other to perform a thermoacoustic cooling process. In this system, the transducer is adapted to generate sound waves within the fluid such that compression and decompression of the fluid provides a temperature gradient across the semiconductor chip to transfer heat from the semiconductor chip to the heat exchanger, and the heat exchanger is adapted to remove heat from the fluid in the container. In various embodiments the semiconductor chip may have an air-bridge wiring structure with spaces distributed within the structure to receive the fluid.

One aspect of this disclosure relates to a method for thermoacoustically cooling a semiconductor structure. According to various embodiments, sound waves are generated in a fluid medium in a container to generate a standing pressure wave in the fluid medium. The fluid medium is placed in contact with a portion of the semiconductor structure at a predetermined position with respect to the standing wave. Heat is removed from the semiconductor structure using a temperature gradient in the fluid medium. The temperature gradient is controlled by the standing pressure wave and the position of the semiconductor structure in the fluid medium.

One aspect of this disclosure relates to a method for forming a thermoacoustic device for cooling a semiconductor chip. According to various embodiments, at least one semiconductor chip is packaged in a support frame containing openings through which a fluid is allowed to flow. The chip is placed into a chamber containing a transducer and a heat exchanger, and the chamber is sealed except for an opening for filling. The chamber is filled through the opening with a fluid which may be pressurized and which acts as a medium for sound waves from the transducer. In various embodiments, the semiconductor chip has a wiring structure supported with a temporary support material, and the temporary support material is removed prior to placing the chip into the chamber to leave spaces in the wiring structure to receive the fluid.

This Summary is an overview of some of the teachings of the present application and is not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which is not to be taken in a limiting sense. The scope of the present invention is defined by the appended claims and their legal equivalents.

DETAILED DESCRIPTION

The following detailed description refers to the accompanying drawings which show, by way of illustration, specific aspects and embodiments in which the present invention may be practiced. The various embodiments are not necessarily mutually exclusive, as aspects of one embodiment can be combined with aspects of another embodiment. These embodiments are described in sufficient detail to enable those skilled in the art to practice the invention. Other embodiments may be utilized and structural, logical, and electrical changes may be made without departing from the scope of the present invention.

The term substrate is understood to include semiconductor wafers. Both wafer and substrate include doped and undoped semiconductors, epitaxial semiconductor layers supported by a base semiconductor or insulator, as well as other semiconductor structures well known to one skilled in the art. The term conductor is understood to include metals and semiconductors, and the term insulator or dielectric is defined to include any material that is less electrically conductive than the materials referred to as conductors. The term metal is understood to include an element or an alloy of elements wherein the electrical and or thermal conductivity is greater than that of a semiconductor.

Disclosed herein is a cooling system and method for semiconductor devices. The disclosed thermoacoustic cooling system uses sound waves to provide improved cooling for semiconductor devices. The disclosed system provides active extraction of heat without the use of mechanical refrigeration, allows the production and packaging of semiconductor chips with standard metal insulator structures or air-bridge structures while still providing enhanced cooling, and provides improved electromigration resistance and conductivity. The disclosed system further provides good insulation characteristics to reduce undesirable capacitive interactions in integrated circuits.

Figure 1:
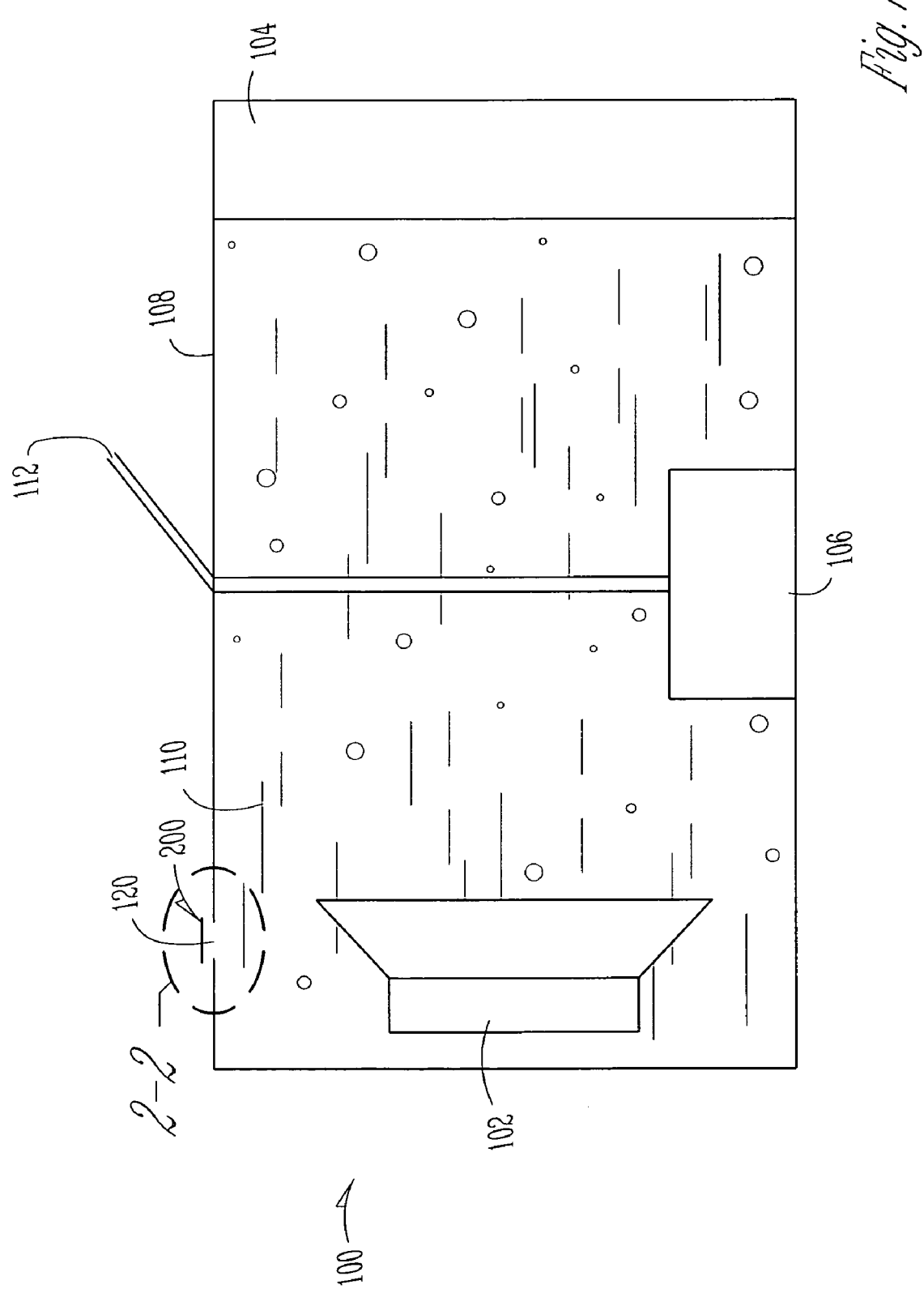
FIG. 1 illustrates a cross-sectional side view of a thermoacoustic cooling system, according to various embodiments.

FIG. 1 illustrates a cross-sectional side view of a thermoacoustic cooling system, according to various embodiments. The thermoacoustic cooling system 100 includes a container 108 to hold a fluid 110 (illustrated as the hatching within the interior of container 108) and to hold at least one semiconductor chip 106 having surfaces to be in contact with the fluid 110. In various embodiments, the fluid 110 may be pressurized to a pressure greater than atmospheric pressure. In various embodiments, the at least one semiconductor chip 106 includes a multi-chip assembly. The system also includes a transducer 102 and a heat exchanger 104 to be disposed within the container 108 and operably positioned with respect to each other and the at least one semiconductor chip 106 to perform a thermoacoustic cooling process. The transducer 102 is adapted to generate sound waves within the fluid 110 such that compression and decompression of the fluid 110 provides a temperature gradient across the at least one semiconductor chip 106 to transfer heat from the at least one semiconductor chip 106 to the heat exchanger 104, which is adapted to remove heat from the fluid 110 in the container 108.

The transducer 102 receives an electrical input and produces a sound or pressure wave output. In various embodiments, the transducer 102 produces sound waves at a frequency of at least 5 kHz. In various embodiments, the transducer 102 produces sound waves at a frequency with a range from approximately 25 kHz to 100 kHz. Higher sound wave frequencies disclosed herein do not cause cavitation in the semiconductors that are in contact with the pressurized fluid.

In various embodiments, the heat exchanger 104 includes a radiator. In various embodiments, the heat exchanger 104 provides increased surface area to dissipate heat, similar to a cooling fin.

The chamber, or container 108, can be fabricated from a number of materials such as metal, insulator material, or combinations of several materials. A number of conductive connecting structures 112 are shown on an outer surface of the container 108. In various embodiments the number of conductive connecting structures 112 includes connections similar to controlled collapse chip connect (C4) structures. In various embodiments, at least one opening 120 is included in the container 108. A closer view of an example opening 120 is shown in FIG. 2.

In various embodiments, the fluid 110 conducts heat away from the semiconductor chip 106 while also providing low dielectric constant insulating properties. In various embodiments, the fluid 110 includes a liquid. In various embodiments, the fluid 110 includes a mixture of liquid and gas (e.g. a boiling liquid). In various embodiments, the fluid 110 includes a pressurized gas of one or more components. In various embodiments, the gas includes helium. In various embodiments, the gas includes hydrogen. In various embodiments, the gas includes a mixture of hydrogen and helium. Hydrogen and helium gasses have advantages that include low dielectric constant for good insulation, while also possessing high thermal conductivity. Hydrogen and helium gasses are also substantially inert to trace conductor materials, thus reducing or eliminating corrosion problems for semiconductor devices with air gap insulator structures.

Hydrogen includes an advantage of low permeability or diffusivity through metals, glasses, and other packaging materials. Low permeability is advantageous because over time, and at elevated temperatures, as the gas diffuses out through the container 108, the level of insulating and heat conducting properties diminishes. Among other advantages, pressurizing the gas ensures that while small amounts of gas may diffuse out of the container 108, there will still be a supply of gas remaining for insulating and heat conducting. Pressurizing the gas further provides enhanced thermal conduction properties. For example, pressures of 5–50 MPa yield a thermal conductivity of $1.6 \times 10^{-3}$ to $1.6 \times 10^{-2}$ cal-cm/sec $^\circ$ C. respectively. This compares to a value of $2.3 \times 10^{-2}$ cal-cm/sec $^\circ$ C. for fused silica and $5.7 \times 10^{-5}$ cal-cm/sec $^\circ$ C. for air at atmospheric pressure.

Figure 2:
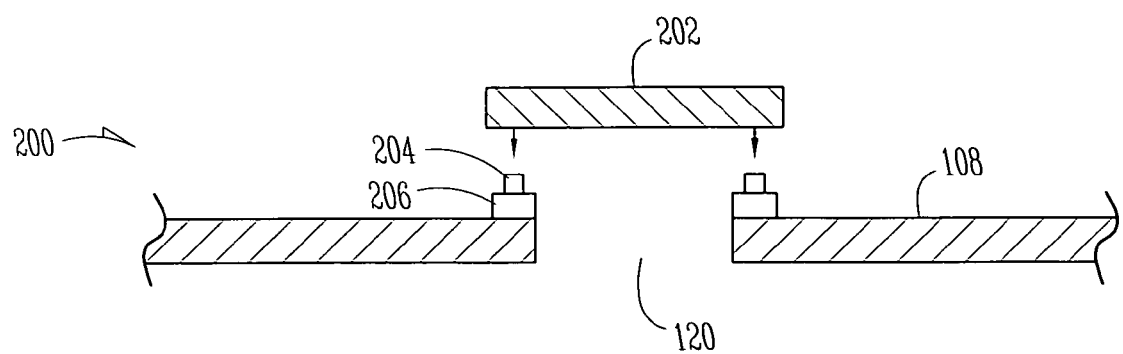
FIG. 2 illustrates a close up view of a portion of FIG. 1.

FIG. 2 illustrates a close up view of a portion of FIG. 1. In various embodiments, fluid 110 is introduced to the container 108 through a sealing device 200. In various embodiments, the sealing device 200 includes a metal ring 206 that is deposited around the opening 120 in the container 108. A solder ring 204 is then deposited over the metal ring 206. In one embodiment, the solder ring 204 has a melting temperature higher than the connecting structures 112, and lower than that of any internal C4 structures. A lid 202 such as a metal lid is also shown that completes a seal over the opening after the fluid 110 is introduced inside the container 108.

Figure 3A:
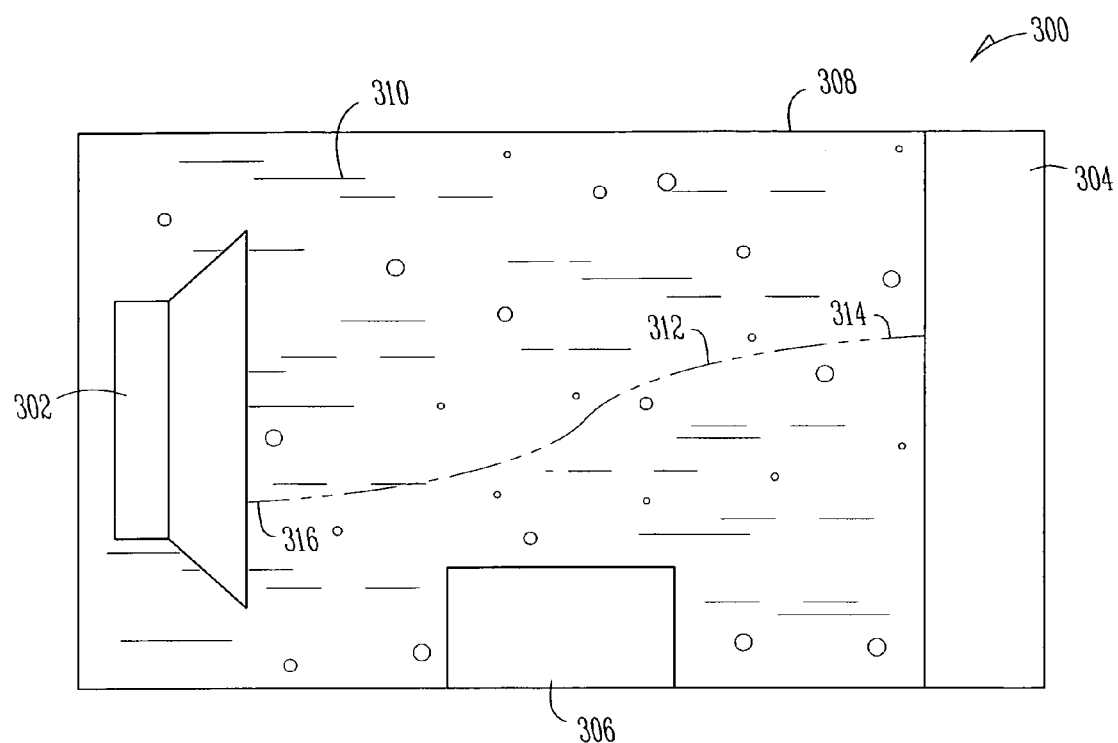
FIG. 3A illustrates a pressure amplitude curve for a half-wavelength system, according to various embodiments.

FIG. 3A illustrates a pressure amplitude curve for a half-wavelength system, according to various embodiments. A thermoacoustic cooling apparatus 300 has a transducer 302 and a heat exchanger 304 enclosed within a chamber 308. A semiconductor chip 306 is disposed between the transducer 302 and the heat exchanger 304. A fluid 310 fills the chamber, acting as a medium for sound waves and heat flow. In various embodiments, the fluid 310 may be pressurized to a pressure greater than atmospheric pressure. The transducer 302 generates a standing pressure wave 312 within the fluid 310 causing a temperature gradient and heat flow from the semiconductor chip 306 to the heat exchanger 304. The standing pressure wave 312 is shown to have the highest pressure and temperature in a first region 314 nearest the heat exchanger 304, and the lowest temperature and pressure in a second region 316 closest the transducer 302. One of skill in the art will appreciate that the standing pressure wave 312 is shown in the figure as a sinusoidal wave for ease of illustration.

Figure 3B:
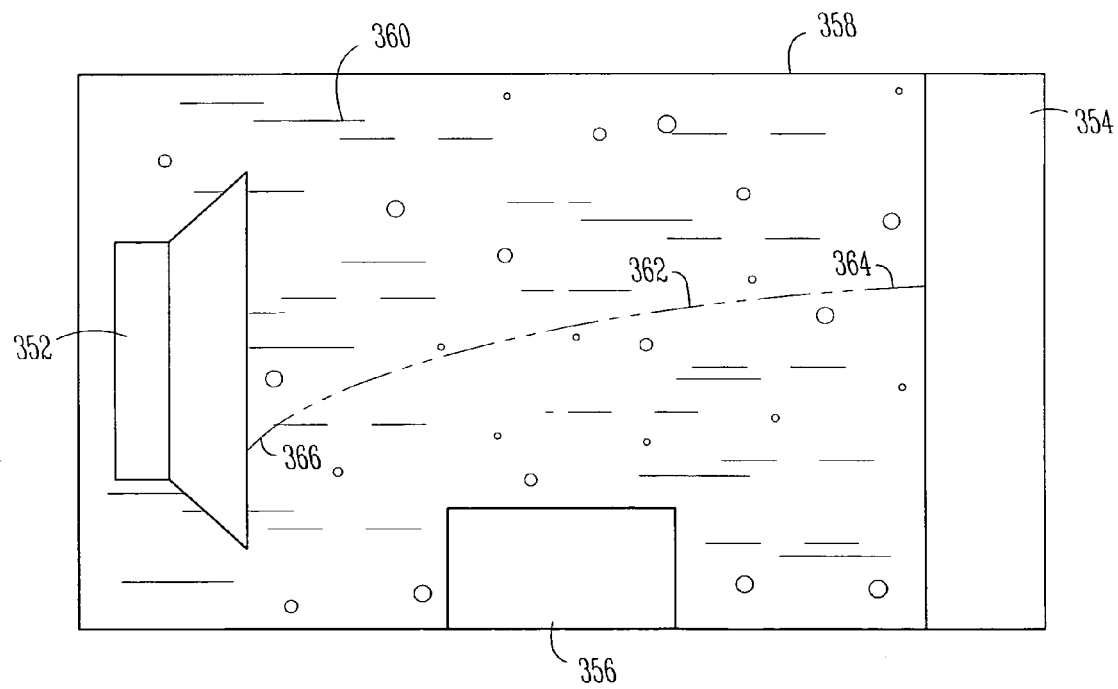
FIG. 3B illustrates a pressure amplitude curve for a quarter-wavelength system, according to various embodiments.

FIG. 3B illustrates a pressure amplitude curve for a quarter-wavelength system, according to various embodiments. A thermoacoustic cooling apparatus 350 has a transducer 352 and a heat exchanger 354 enclosed within a chamber 358. A semiconductor chip 356 is disposed between the transducer 352 and the heat exchanger 354. A fluid 360 fills the chamber, acting as a medium for sound waves and heat flow. In various embodiments, the fluid 360 may be pressurized to a pressure greater than atmospheric pressure. The transducer 352 generates a standing pressure wave 362 within the fluid 360, causing a temperature gradient and heat flow from the semiconductor chip 356 to the heat exchanger 354. The standing pressure wave 362 is shown to have the highest pressure and temperature in a first region 364 nearest the heat exchanger 354, and the lowest temperature and pressure in a second region 356 closest the transducer 352. One of skill in the art will appreciate that the standing pressure wave 362 is shown in the figure as a sinusoidal wave for ease of illustration.

Figure 4:
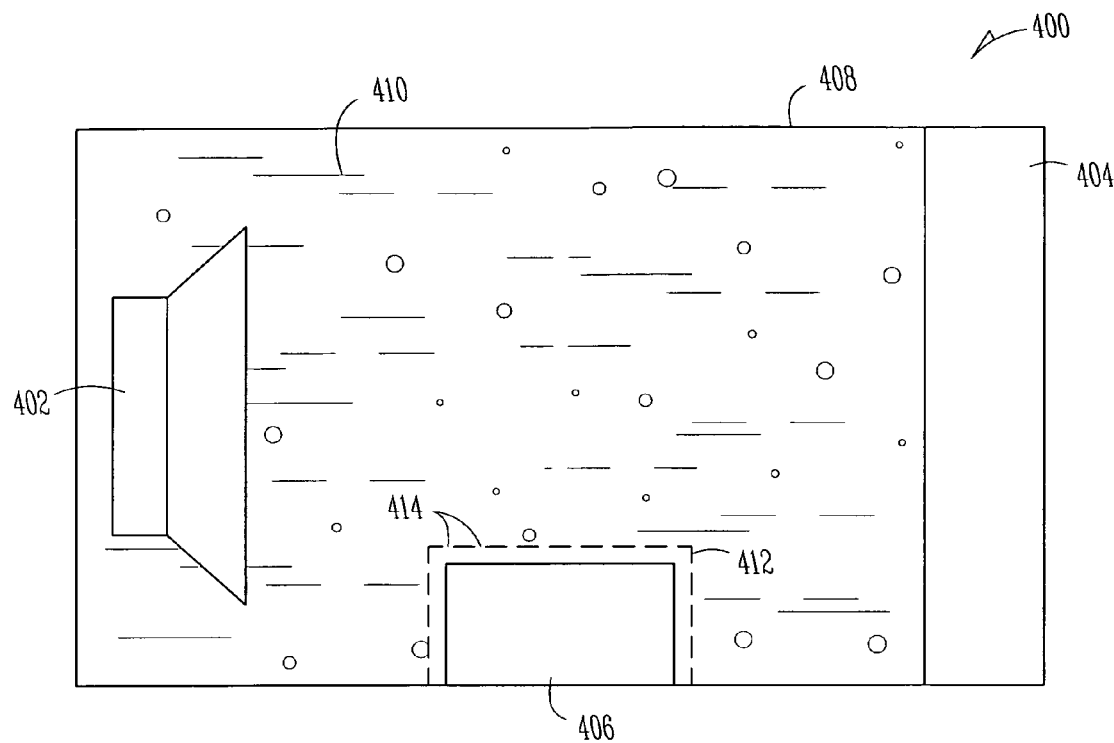
FIG. 4 illustrates a cross-sectional side view of a thermoacoustic cooling system with porous semiconductor packaging, according to various embodiments.

FIG. 4 illustrates a cross-sectional side view of a thermoacoustic cooling system with porous semiconductor packaging, according to various embodiments. The thermoacoustic cooling system 400 includes a container 408 holding a pressurized fluid 410, and at least one semiconductor chip 406 having surfaces to be in contact with the pressurized fluid 410. In various embodiments, the semiconductor chip 406 is packaged in a support frame 412 containing a plurality of openings 414 through which the pressurized fluid 410 is allowed to flow. In various embodiments, the at least one semiconductor chip 406 includes a multi-chip assembly. The system also includes a transducer 402 and a heat exchanger 404 within the container 408 and operably positioned with respect to each other and the semiconductor chip 406 to perform a thermoacoustic cooling process. The transducer 402 is adapted to generate sound waves within the pressurized fluid 410 such that compression and decompression of the pressurized fluid 410 provides a temperature gradient across the semiconductor chip 406 to transfer heat from the semiconductor chip 406 to the heat exchanger 404, which is adapted to remove heat from the pressurized fluid 410 in the container 408. The support frame 412 with openings 414 provides the advantage of allowing the pressurized fluid 410 greater surface contact with the semiconductor chip 406, allowing more heat transfer to the pressurized fluid 410.

Figure 5:
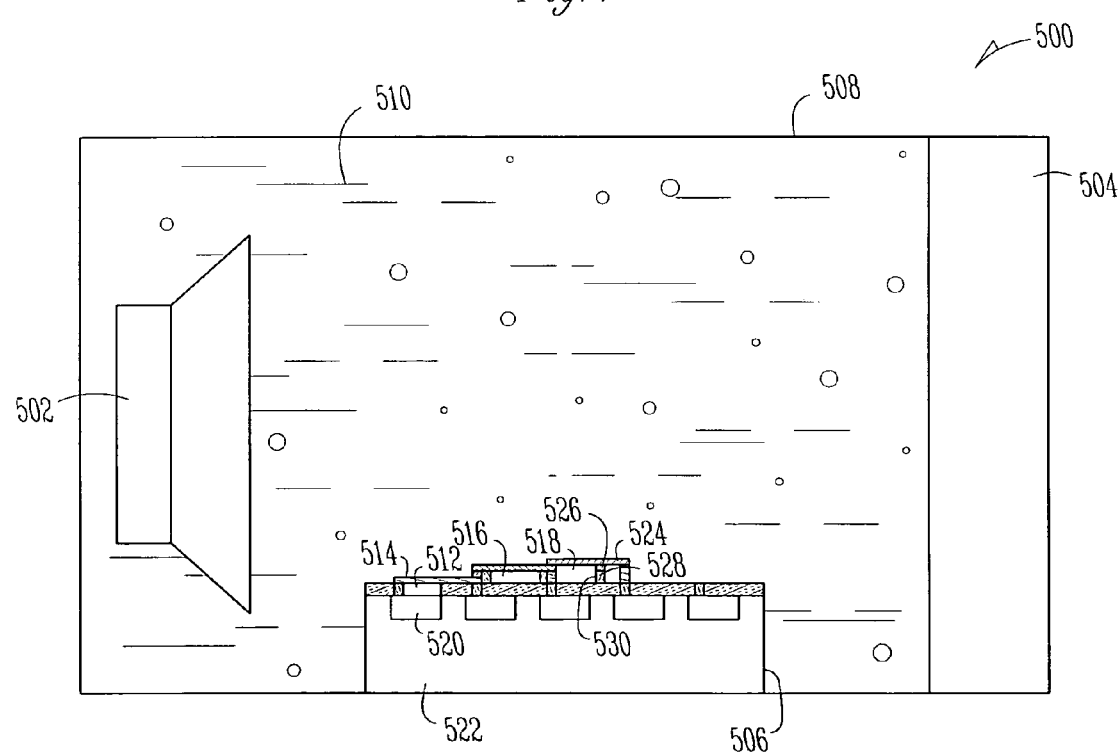
FIG. 5 illustrates a cross-sectional side view of a thermoacoustic cooling system with an air-bridge wiring structure, according to various embodiments.

FIG. 5 illustrates a cross-sectional side view of a thermoacoustic cooling system with an air-bridge wiring structure, according to various embodiments. The thermoacoustic cooling system 500 includes a container 508 holding a transducer 502, a heat exchanger 504, a pressurized fluid 510 and an integrated circuit 506. The integrated circuit 506 is shown formed on a substrate 522 such as a silicon wafer. Other substrates 522 include various semiconductors, semiconductor layers, silicon-on-insulator (SOI) structures, etc. A number of electronic devices 520 are shown formed on or within the substrate 522. In various embodiments, the number of electronic devices 520 includes a number of transistors, capacitors, etc. In various embodiments, the number of electronic devices 520 is configured into memory cells in a memory device. In various embodiments, the number of electronic devices 520 is configured into a logic circuit such as a processor circuit.

A number of conductor paths are formed to connect the number of electronic devices 520. In various embodiments, the conductor paths are formed as metal paths, although other conductor materials can be used. A trace conductor 514 is shown connecting multiple electronic devices 120. In one embodiment, the trace conductor 514 includes a metal trace. Although a number of materials are possible for trace conductors, some examples include aluminum and copper, which have desirable properties such as low resistance and high thermal conductivity.

In various embodiments, the trace conductor 514 is formed to leave an air gap 512 or air-bridge structure. As described above, air gap insulation is desirable due to improved capacitance interactions in the integrated circuit 506. However, thermal conduction through air is not as effective as through most solid insulator materials. A second air gap 516 and a third air gap 518 are further shown in FIG. 5. In various embodiments, a trace conductor 524 is at least partially supported by a support structure 530 over a portion of the length of the air gap 518. In one embodiment, the support structure 530 includes a metal portion 526 and an insulator portion 528. A metal portion 526 is constructed during other fabrication processes as layers are built up on the integrated circuit 506, and the insulator portion 528 keeps the trace conductor 524 electrically isolated over its length. The design of the air gap or air-bridge structure allows the pressurized fluid 510 to enter the structure and contact more surface area of the structure, thereby increasing the amount of heat removal from the integrated circuit 506.

Figure 6:
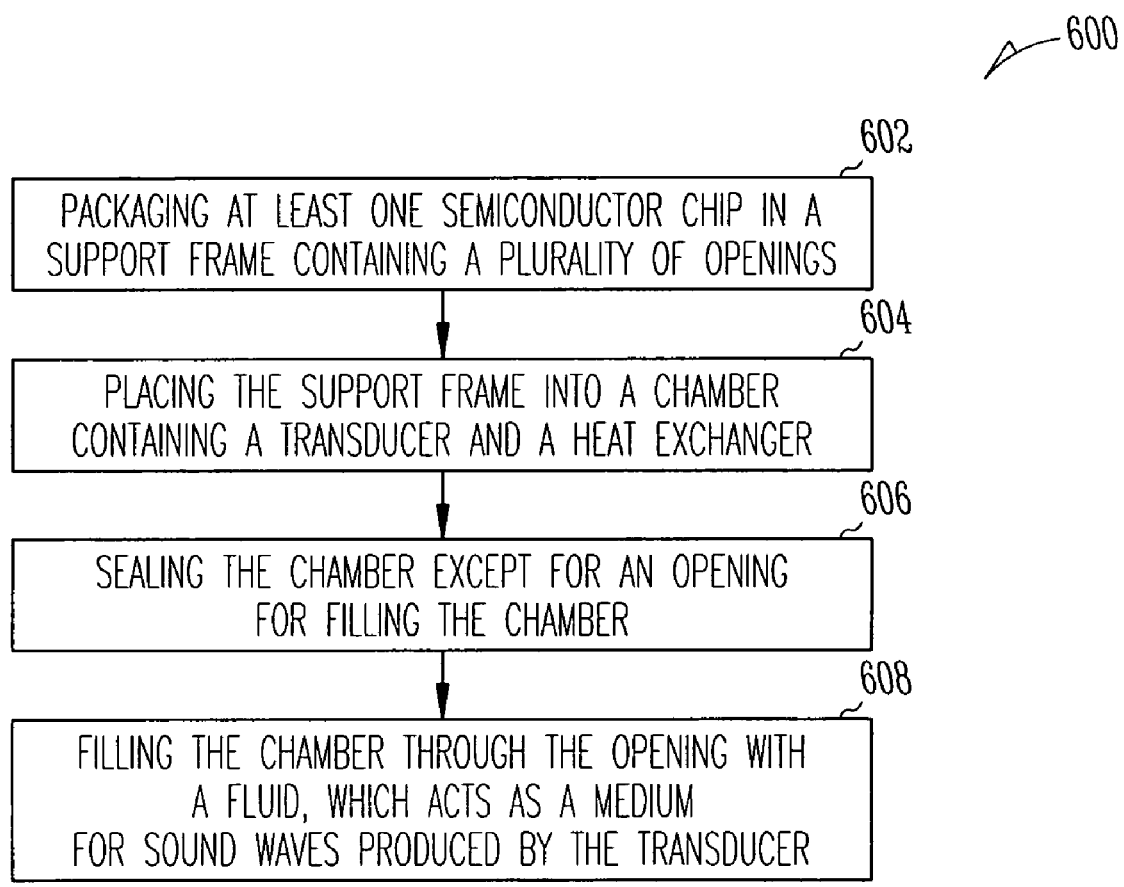
FIG. 6 illustrates a flow diagram of a method for constructing a thermoacoustic cooling system, according to various embodiments.

FIG. 6 illustrates a flow diagram of a method for constructing a thermoacoustic cooling system, according to various embodiments. According to various embodiments of the method 600, at least one semiconductor chip is packaged in a support frame, the support frame containing a plurality of openings through which a fluid is allowed to flow at 602. In various embodiments, the at least one semiconductor chip includes a multi-chip assembly. At 604, the chip is placed into a chamber containing a transducer and a heat exchanger. At 606, the chamber is sealed except for an opening to fill the chamber. At 608, the chamber is filled through the opening with the fluid disposed to act as a medium for sound waves from the transducer.

According to various embodiments, the method shown in FIG. 6 can be used to construct a system for cooling an integrated circuit with an air-bridge wiring structure. When the semiconductor chip has a wiring structure with a temporary support material, the temporary support material is removed from the chip prior to placing the chip into the chamber, leaving spaces in the wiring structure. In various embodiments, the temporary support material is a layer of organic material that can be chemically removed. In various embodiments, examples include carbon, a polymer such as polymide or photoresist, or a parylene such as parylene C. Subsequent filling of the chamber with the fluid includes filling the spaces in the wiring structure.

Figure 7:
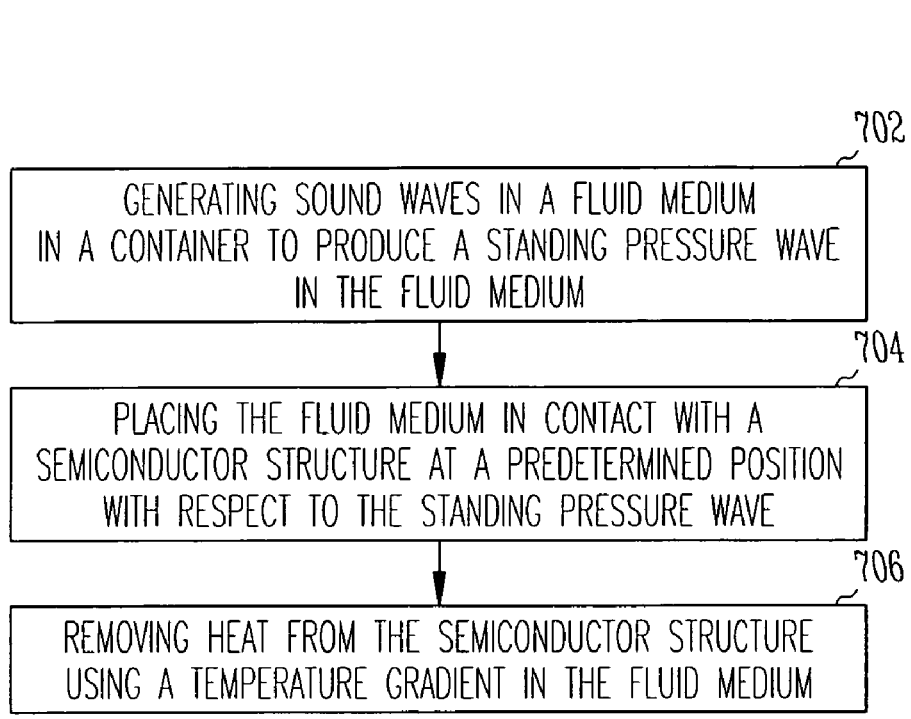
FIG. 7 illustrates a flow diagram of a method for cooling a semiconductor structure, according to various embodiments.

FIG. 7 illustrates a flow diagram of a method 700 for cooling a semiconductor structure, according to various embodiments. At 702, sound waves are generated in a fluid medium in a container to generate a standing pressure wave in the fluid medium. At 704, the fluid medium is placed in contact with the semiconductor structure at a predetermined position with respect to the standing pressure wave. At 706, heat is removed from the semiconductor structure using a temperature gradient in the fluid medium. The temperature gradient is controlled by the standing pressure wave and the position of the semiconductor structure in the fluid medium. As stated above, the standing pressure wave has the highest pressure and temperature in the region nearest the heat exchanger, and the lowest temperature and pressure in the region closest the transducer. According to various embodiments, the sound waves have a frequency of at least 25 kHz. According to various embodiments, the sound waves are generated by a transducer operating in the megasonic frequency range. The megasonic frequency range is generally defined as sound wave frequencies in excess of 100 kHz. As stated above, an advantage of the present system is that higher frequencies are used for thermoacoustic cooling, as lower frequencies were found to cause cavitation in ultrasonic cleaning systems.

Figure 8:
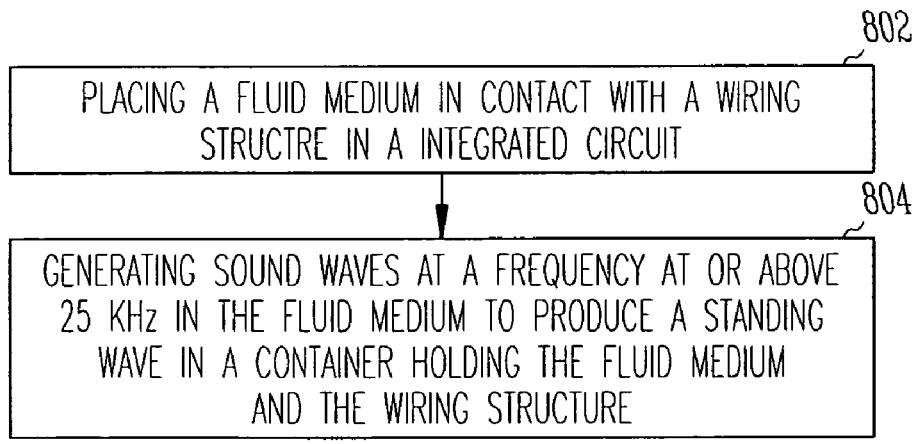
FIG. 8 illustrates a flow diagram of a method for cooling an integrated circuit with an air-bridge wiring structure, according to various embodiments.

FIG. 8 illustrates a flow diagram of a method 800 for cooling an integrated circuit with an air-bridge wiring structure, according to various embodiments. At 802, a fluid medium is placed in contact with a wiring structure in the integrated circuit. In an air-bridge wiring structure, the wiring structure is suspended without contact to other structures over at least a portion of its length. At 804, sound waves are generated at a frequency at or above approximately 25 kHz in the fluid medium to produce a standing wave in a container holding the fluid medium and the wiring structure. The sound waves compress and decompress the fluid medium to form a temperature gradient and provide cooling for the wiring structure. According to various embodiments, the sound waves are generated by a transducer held in the container. According to various embodiments, heat flows from the wiring structure to a heat exchanger due to the temperature gradient. According to various embodiments, the heat exchanger is a radiator, one or more heat fins, or other conventional heat removing structures.

Figure 9A:
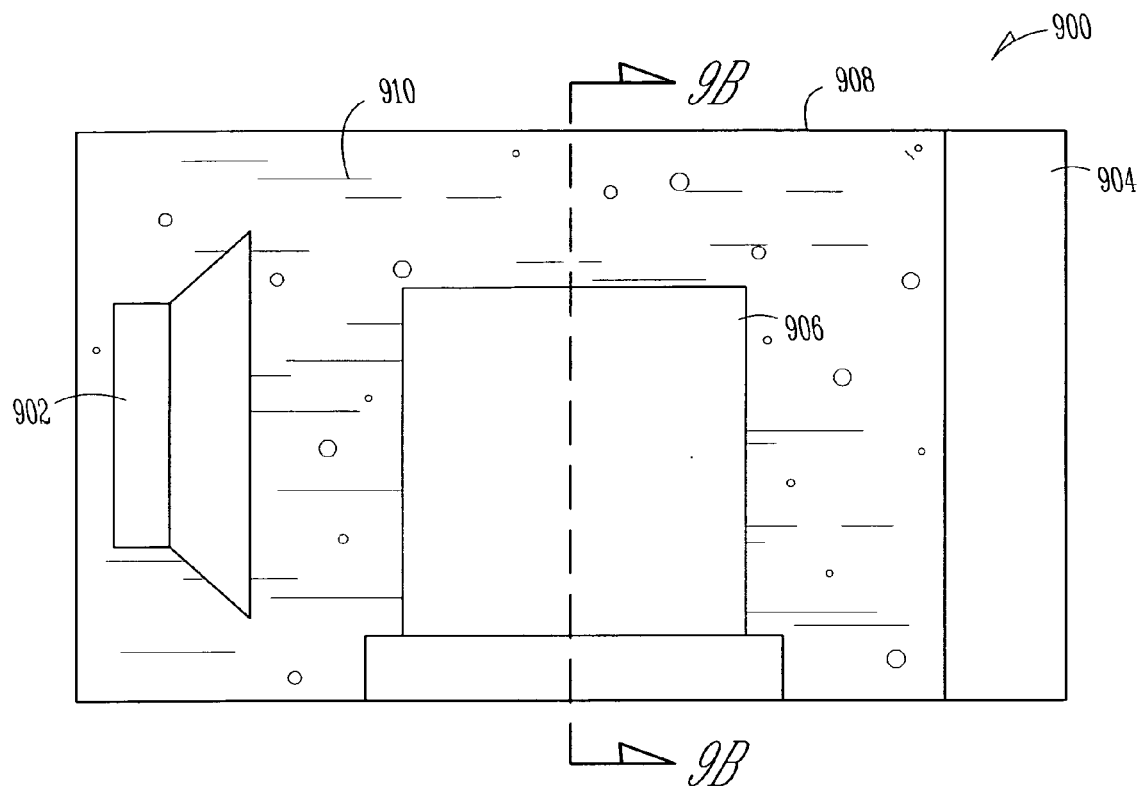
FIG. 9A illustrates a cross-sectional side view of a thermoacoustic cooling system with a stacked chip cube, according to various embodiments.
Figure 9B:
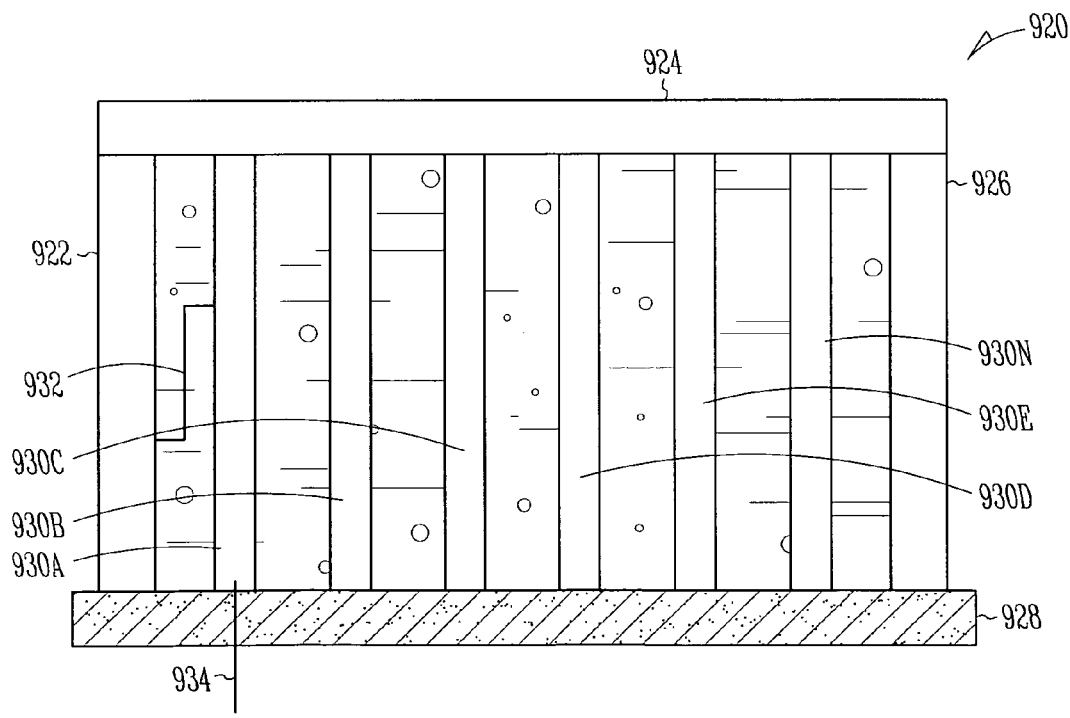
FIG. 9B illustrates a cross-sectional view of a portion of FIG. 9A.

FIG. 9A illustrates a cross-sectional side view of a thermoacoustic cooling system with a stacked chip cube, according to various embodiments. As the illustration provides, the thermoacoustic cooling system 900 disclosed herein is compatible with cooling single or multiple chips or circuits. A chip cube 906 is placed in the container 908 with a transducer 902, a heat exchanger 904 and pressurized fluid 910. The structure of the chip cube 906, as shown in FIG. 9B, allows for free flow of fluid 910 and sound waves through the assembly. According to various embodiments, the transducer 902 generates a standing sound wave within the container 908, the sound wave compressing and decompressing the fluid 910 to form a temperature gradient and provide cooling for the chip cube 906.

FIG. 9B illustrates a cross-sectional view of a portion of FIG. 9A, taken along line 9B–9B of FIG. 9A. The cross-section of the chip cube 920 shows an arrangement of logic chips and memory chips within a system. According to various embodiments, the memory chips 930*a*–930*n* are in a cube structure with spaces between the chips and attached to the substrate 928. These spaces between the memory chips 930*a*–930*n* increase the surface area of the chips in contact with the fluid, regardless of whether the chips include conventional insulator structures or air gaps. In various embodiments, spaces can be made using spacers, or balls of solder a few mills in diameter. Logic chips 922, 924 and 926 are positioned on the sides and the top of the memory chips 930*a*–930*n*, but not on the ends, allowing the free flow of the fluid and of sound waves through the chip cube, according to various embodiments. The logic chips and memory chips are connected with conventional wiring, both within the cube via connectors 932 and to external devices via connectors 934. The chip cube arrangement shown is not intended to be inclusive of all the possible arrangements which might be used in the implementation of this system.

The present system and method can be used to control the operating temperature of a semiconductor system, or a portion of a semiconductor system, according to various embodiments. Controlling the chip temperature within a range such as +/−20 degrees C. or narrower has a number of advantages. With a narrow temperature range, the resulting material properties also exhibit much less variation. When extreme temperature conditions are eliminated, there is no need to provide acceptable operation under these extreme operating conditions. This allows circuit and device designers an opportunity to design more efficient structures. Some properties that exhibit less variation when temperature ranges are controlled include electromigration, conductivity, operating speed, and reliability.

Figure 10:
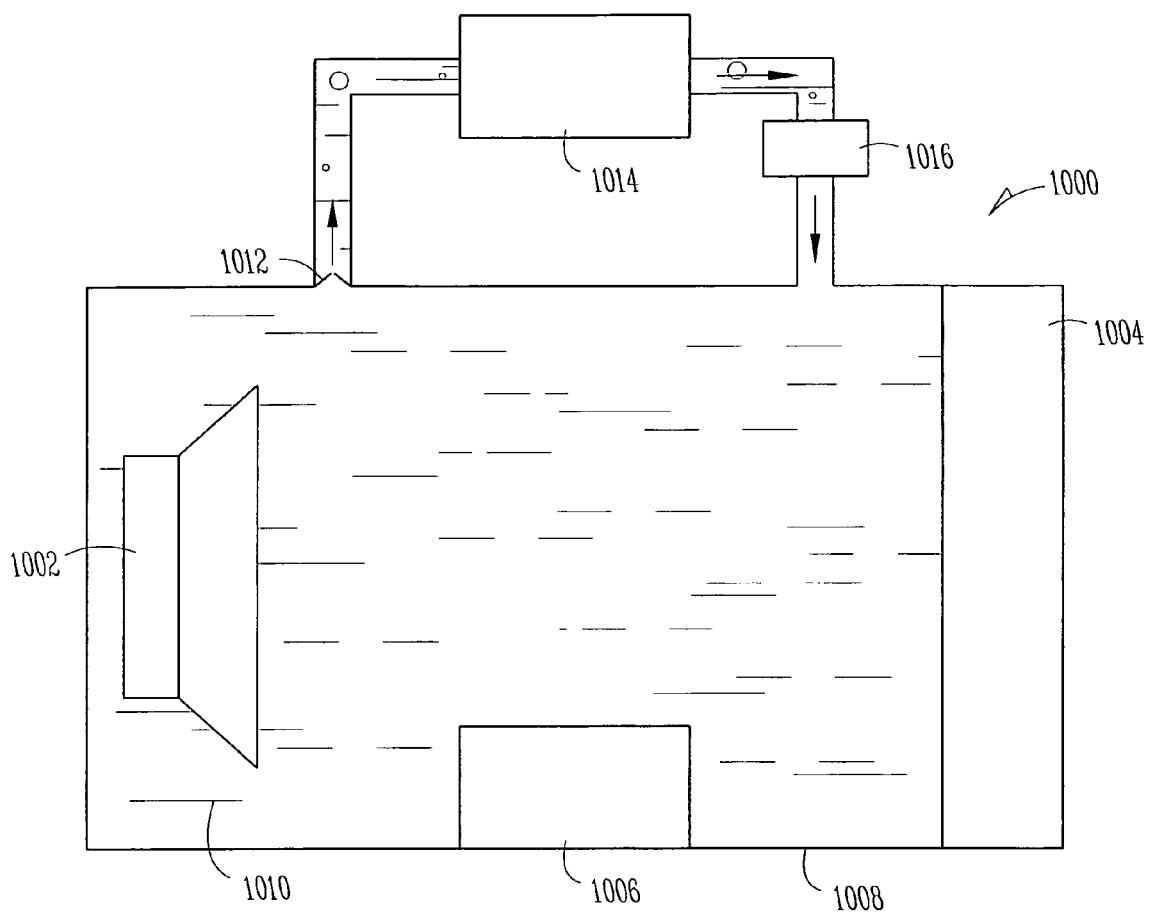
FIG. 10 illustrates a cross-sectional side view of a system for controlling the temperature of operation, according to various embodiments.

FIG. 10 illustrates a cross-sectional side view of a system for controlling the temperature of operation, according to various embodiments. An integrated circuit 1006 is held in a liquid 1010 within a container 1008. The liquid is chosen with a boiling temperature that is also a desired operating temperature for the integrated circuit 1006. In various embodiments, the liquid includes iso-butyl-flouride, also known as (1-F-2-Me-propane) [$(CH_3)_2$ $CHCH_2F$], which has a boiling point of 16° C. An example operating range of an integrated circuit using iso-butyl-flouride includes a range from 6° C. to 26° C. In various embodiments, the liquid includes diazo-methane [$CH_2N_2$], with a boiling point of −23° C. An example operating range of an integrated circuit using diazo-methane includes a range from −33° C. to −13° C. In various embodiments, the liquid includes propane [$CH_3CH_2CH_3$], with a boiling point of −42° C. An example operating range of an integrated circuit using propane includes a range from −52° C. to −32° C.

In various embodiments, the liquid is present in sufficient amounts and with sufficient thermal contact surface area to maintain the temperature of the integrated circuit 1006 at approximately the boiling point temperature of the liquid material. As the liquid boils and changes into gas, it flows from the container 1008 via the pressure relief valve 1012. The gas is then cooled into liquid using a condenser 1014 and returned to the container by the pump 1016. According to various embodiments, the pressure relief valve 1012 is a one-way valve actuated by vapor pressure of the boiling liquid. According to various embodiments, the condenser 1014 cools the gas into liquid using the thermoacoustic cooling process described above. According to various embodiments, the condenser 1014 is a mechanical refrigeration device.

According to various embodiments, a transducer 1002 and heat exchanger 1004 are also disposed within the container. The transducer 1002 generates sound waves within the liquid 1010 to thermoacoustically cool the integrated circuit 1006, to further assist in controlling the range of operating temperatures of the integrated circuit.

Figure 11:
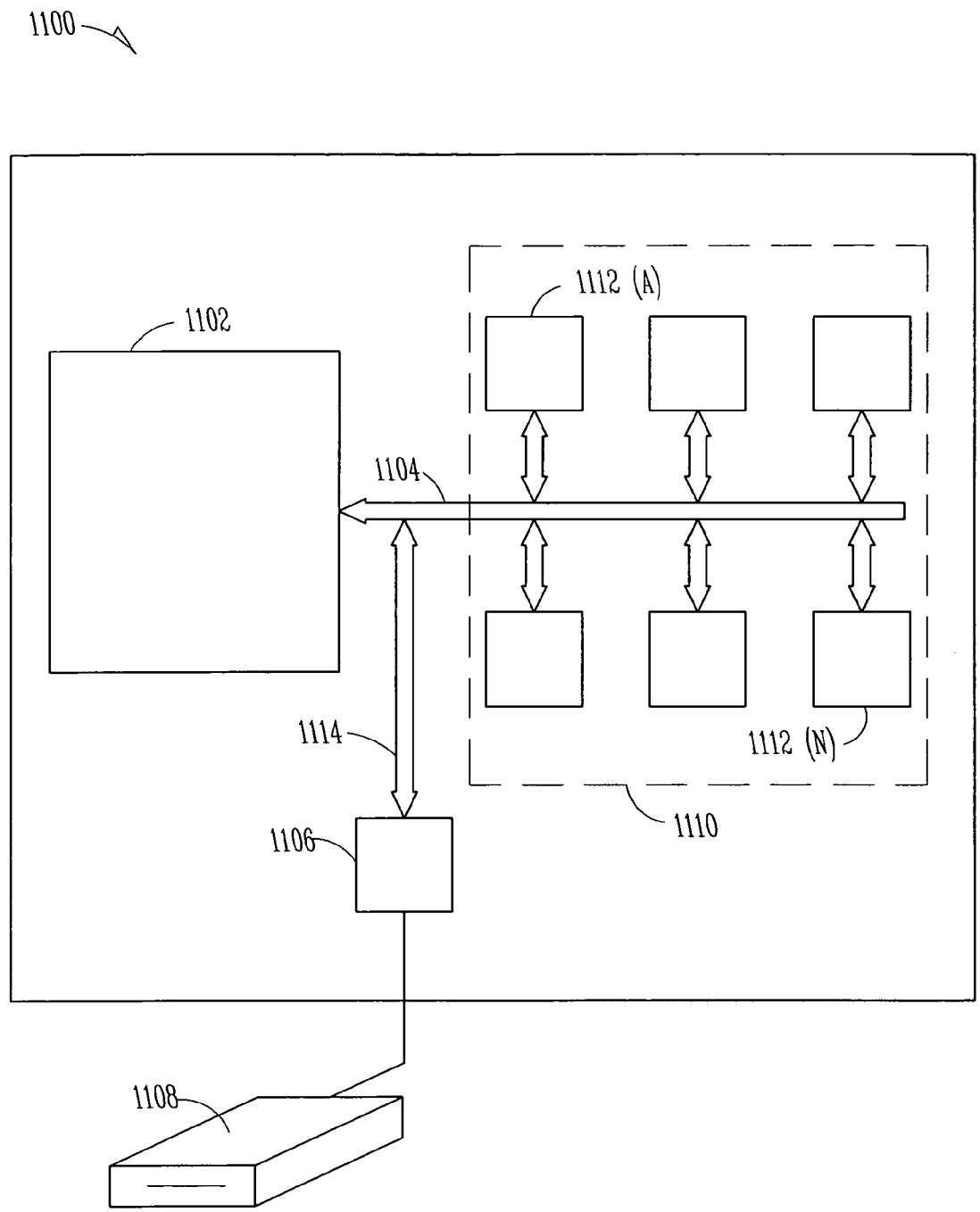
FIG. 11 illustrates a block diagram of a personal computing system, according to various embodiments.
Figure 12:
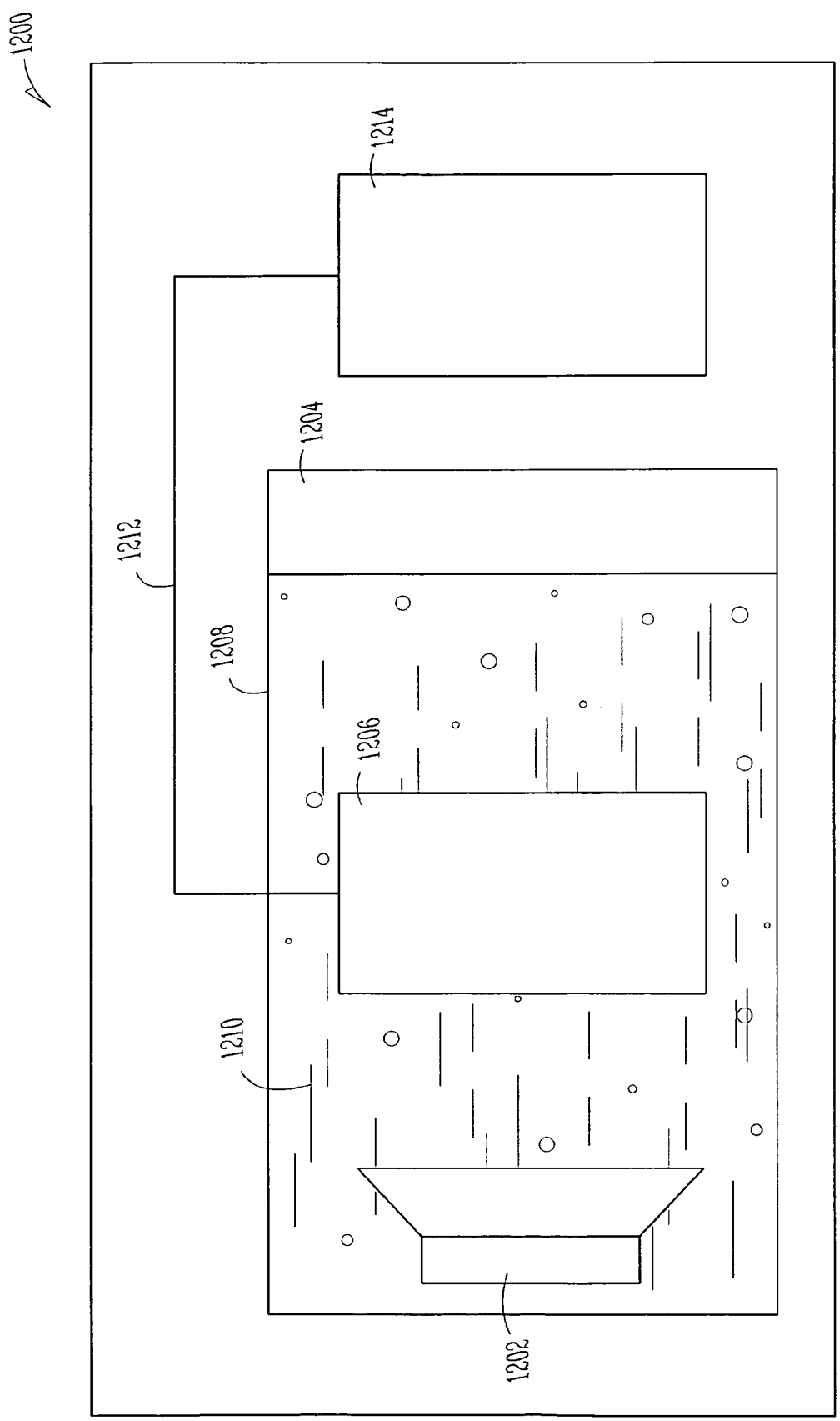
FIG. 12 illustrates a block diagram of a processing unit and memory device, according to various embodiments.

Semiconducting wafers, semiconductor devices, and IC's including cooling methods and systems described above may be implemented into memory devices and information handling devices as shown in FIG. 11 and FIG. 12, and as described below. Chips such as memory chips, processor chips, and other integrated circuits can be cooled using methods and devices described above.

Another example includes a complete system-on-a-chip (SOC). SOC solutions are being designed and made available for a variety of new applications viz. hand-held devices and wireless and broadband networking systems. These include on one end mobile applications such as cellular phones, PDAs, digital cameras, etc.; and at the other end, network and internet infrastructure applications such as routers, switches, hubs, etc. These chips integrate complex analog, RF, logic and memory functions, and require steady levels of high performance with minimum power dissipation. Within a chip, different functions operate at different energy levels, and therefore create different rates of heat dissipation and thermal gradients. To address such challenges, constant design compromises are being made in analog and digital performance to control heat and power dissipation to meet performance and reliability objectives. Such devices will greatly improve performance and reliability if integrated with a cooling system as described in the present disclosure.

Further, in various embodiments, multiple cooling systems and methods are selected to cool individual circuits or chips to their respective individual needs. For example, a processor chip may need to be held at a higher constant temperature than a memory chip due to differences in the heat that each chip produces during operation. Conversely it may be desirable to maintain both segments of the system at the same temperature, with the differing heat loads dictating the use of different cooling mechanisms. While specific types of memory devices and computing devices are shown below, it will be recognized by one skilled in the art that several types of memory devices and information handling devices could utilize this technology.

FIG. 11 illustrates a block diagram of a personal computing system, according to various embodiments. The computing system 1100 includes a processor 1102, a memory bus circuit 1110 having a plurality of memory slots 1112a–1112n, and other peripheral circuitry 1106. Peripheral circuitry 1106 permits various peripheral devices 1108 to interface processor-memory bus 1104 over input/output (I/O) bus 1114. The computing system 1100 shown in FIG. 11 also includes at least one semiconductor chip utilizing thermoacoustic cooling as disclosed herein.

Processor 1102 produces control and address signals to control the exchange of data between memory bus circuit 1110 and processor 1102, and between memory bus circuit 1110 and peripheral circuitry 1106. This exchange of data is accomplished over high speed memory bus 1104 and over high speed I/O bus 1114. Coupled to memory bus 1104 are a plurality of memory slots 1112a–1112n which receive memory devices well known to those skilled in the art. For example, single in-line memory modules (SIMMs) and dual in-line memory modules (DIMMs) may be used in various embodiments. These memory devices can be produced in a variety of designs which provide different methods of reading from and writing to the dynamic memory cells of memory slots 1112. One such method is the page mode operation. An alternate type of device is the extended data output (EDO) memory. Other alternative types of devices include SDRAM, DDR SDRAM, SLDRAM and Direct RDRAM as well as others such as SRAM or Flash memories.

According to various embodiments, the present system and method can be used with multiple chips and multiple temperature zones within a system. Portions of a computing system, such as the processor for example, generate more heat than other devices in the system and can be selectively cooled using the disclosed system and method.

FIG. 12 illustrates a block diagram of a processing unit and memory device, according to various embodiments. A computing system 1200 includes a processor 1206 connected to a memory device 1214 via a memory bus 1212. The processor 1206 is contained within a chamber 1208, along with a transducer 1202, a heat exchanger 1204, and a pressurized fluid 1210. The transducer 1202 is adapted to generate sound waves within the pressurized fluid 1210 such that compression and decompression of the pressurized fluid provides a temperature gradient to transfer heat away from the processor 1206 and to the heat exchanger 1204. The disclosed system can be used to selectively cool other components of the computing system, according to various embodiments. Further, the thermoacoustic cooling system and method disclosed can be used to remove heat from all or portions of other electronic devices that use semiconductor chips, according to various embodiments.

This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiment shown. This application is intended to cover adaptations or variations, and includes any other applications in which the above structures and fabrication methods are used. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A system, comprising:
a container to hold a fluid and to hold at least one semiconductor chip having surfaces to be in contact with the fluid, the semiconductor chip having an air bridge wiring structure with gaps distributed therein to receive the fluid;
a transducer and a heat exchanger to be disposed within the container and operably positioned with respect to each other and the at least one semiconductor chip to perform a thermoacoustic cooling process; and
wherein the transducer is adapted to generate sound waves within the fluid such that compression and decompression of the fluid provides a temperature gradient across the at least one semiconductor chip to transfer heat from the at least one semiconductor chip to the heat exchanger, and the heat exchanger is adapted to remove heat from the fluid in the container.

2. The system of claim 1 wherein the sound waves have a frequency of at least 5 kHz.

3. The system of claim 1 wherein the sound waves have a frequency with a range from approximately 25 kHz to approximately 100 kHz.

4. The system of claim 1 wherein the at least one semiconductor chip includes a multi-chip assembly.

5. The system of claim 1 wherein the fluid includes a pressurized fluid.

6. The system of claim 1 wherein the fluid is a gas at a pressure above atmospheric pressure.

7. The system of claim 6 wherein the gas is hydrogen.

8. The system of claim 6 wherein the gas is helium.

9. The system of claim 6 wherein the gas is a mixture of hydrogen and helium.

10. The system of claim 6 wherein the pressure of the gas is greater than 5 MPa.

11. The system of claim 10 wherein the pressure of the gas is within a range between approximately 10 MPa and approximately 50 MPa.

12. A system, comprising:
a container to hold a pressurized fluid and to hold a semiconductor chip having surfaces to be in contact with the pressurized fluid, the semiconductor chip having a structure with spaces distributed therein to receive the pressurized fluid to cool the semiconductor chip;
a transducer and a heat exchanger to be disposed within the container and operably positioned with respect to each other and the semiconductor chip to perform a thermoacoustic cooling process; and
wherein the transducer is adapted to generate sound waves within the pressurized fluid such that compression and decompression of the pressurized fluid provides a temperature gradient across the semiconductor chip to transfer heat from the semiconductor chip to the heat exchanger, and the heat exchanger is adapted to remove heat from the pressurized fluid in the container.

13. The system of claim 12 wherein the pressurized fluid is not electrically conductive.

14. The system of claim 12 wherein the pressurized fluid is thermally conductive.

15. The system of claim 12 wherein the sound waves have a frequency to create a standing wave within the container that is one half the wavelength of the sound wave.

16. The system of claim 12 wherein the sound waves have a frequency to create a standing wave within the container that is one quarter the wavelength of the sound wave.

17. A system, comprising:
a number of electronic devices connected by conductive structures;
a chamber containing
at least one but not all of the electronic devices;
a pressurized fluid in contact with the contained devices;
a transducer and a heat exchanger operably positioned with respect to each other to perform a thermoacoustic cooling process; and
wherein the transducer is adapted to generate sound waves within the pressurized fluid such that compression and decompression of the pressurized fluid provides a temperature gradient to transfer heat away from only the contained devices.

18. The system of claim 17 wherein the number of electronic devices comprise a personal computing system.

19. The system of claim 18 wherein the personal computing system comprises a processor and a memory device.

20. The system of claim 19 wherein the memory device is contained in the chamber.

21. The system of claim 20 wherein the memory device is a DRAM.

22. The system of claim 19 wherein the processor is contained in the chamber.

23. A thermoacoustic cooling apparatus, comprising:
a transducer and a heat exchanger enclosed within a chamber;
a semiconductor chip within the chamber, disposed between the transducer and the heat exchanger;
a pressurized mixture of hydrogen and helium filling the chamber, in contact with each of the transducer, the heat exchanger and the semiconductor chip; and
wherein the transducer generates a standing pressure wave within the pressurized mixture causing a temperature gradient and heat flow from the semiconductor chip to the heat exchanger.

24. The apparatus of claim 23 wherein the standing pressure wave has a frequency within a range from approximately 25 kHz to approximately 100 kHz.

25. The apparatus of claim 23 wherein the semiconductor chip is connected to a circuit using a C4 structure.

26. The apparatus of claim 23 wherein the pressurized mixture contains more helium than hydrogen by volume.

27. The apparatus of claim 26 wherein the pressurized mixture contains 90% helium and 10% hydrogen by volume.

28. A system, comprising:
a container to hold a fluid and to hold a plurality of semiconductor chips having surfaces to be in contact with the fluid, the plurality of semiconductor chips arranged in a structure with spaces between the chips to receive the fluid;
a transducer and a heat exchanger to be disposed within the container and operably positioned with respect to each other and the semiconductor chips to perform a thermoacoustic cooling process; and
wherein the transducer is adapted to generate sound waves within the fluid such that compression and decompression of the fluid provides a temperature gradient across the semiconductor chips to transfer heat from the semiconductor chips to the heat exchanger, and the heat exchanger is adapted to remove heat from the fluid in the container.

29. The system of claim 28 wherein the structure includes a cube structure.

30. The system of claim 28 wherein the structure includes porous packaging.

31. The system of claim 28 further comprising:
solder balls between adjacent chips to provide the spaces.

* * * * *

UNITED STATES PATENT AND TRADEMARK OFFICE
CERTIFICATE OF CORRECTION

PATENT NO. : 7,202,562 B2 Page 1 of 1
APPLICATION NO. : 11/001930
DATED : April 10, 2007
INVENTOR(S) : Farrar It is certified that error appears in the above-identified patent and that said Letters Patent is hereby corrected as shown below:

On the title page:
On page 2, in field (56), under "Other Publications", in column 2, line 9, delete "Monterrey," and insert -- Monterey, --, therefor.

Signed and Sealed this

Twenty-sixth Day of June, 2007

JON W. DUDAS
*Director of the United States Patent and Trademark Office*